United States Patent [19]
Nariani

[11] Patent Number: 5,218,511
[45] Date of Patent: Jun. 8, 1993

[54] INTER-SILICIDE CAPACITOR

[75] Inventor: Subhash R. Nariani, San Jose, Calif.

[73] Assignee: VLSI Technology, Inc., San Jose, Calif.

[21] Appl. No.: 902,197

[22] Filed: Jun. 22, 1992

[51] Int. Cl.$^5$ .......................... H01G 4/06; H01L 29/78
[52] U.S. Cl. ..................................... 361/313; 257/296
[58] Field of Search .............................. 361/311–313; 29/25.42, 25.03; 437/44, 52; 357/51, 23.1, 45, 23.6

[56] References Cited

U.S. PATENT DOCUMENTS

| | | | |
|---|---|---|---|
| 4,922,312 | 5/1990 | Coleman et al. | 357/23.6 |
| 4,975,753 | 12/1990 | Ema | 357/23.6 |
| 5,017,982 | 5/1991 | Kobayashi | 357/23.6 |
| 5,132,756 | 7/1992 | Matsuda | 357/23.1 |

OTHER PUBLICATIONS

C. Kaya, H. Tigelaar, J. Paterson, M. de Wit, J. Fattaruso, D. Hester, S. Kiriakai, K. Tan, F. Tsay, "Polycide/Metal Capacitors for High Precision A/D Converters", IEDM, 1988, pp. 782–785.

T. Ono, T. Mori, T. Ajioka, T. Takayashiki, "Studies of Thin Poly Si Oxides for E and E$^2$PROM", IEDM, 1985, pp. 380–383.

T. Iida, M. Nakahara, S. Gotoh and H. Akiba, "Precise Capacitor Structure Suitable for Submicron Mixed Analog/Digital ASICs", Custom Integrated Circuits Conference, 1990, pp. 18.5.1–18.5.4.

Jim Paterson, "Adding Analog, EPROM and EE-PROM modules to CMOS Logic Technology: How Modular?", IEDM, 1989, pp. 16.1.1–16.1.3.

Primary Examiner—Donald A. Griffin
Attorney, Agent, or Firm—Douglas L. Weller

[57] ABSTRACT

A method produces a capacitor. On a substrate, a polysilicon layer is formed over an insulating region. A first metal-silicide layer is formed on top of the polysilicon layer. A dielectric layer is formed on top of the first metal-silicide layer. A second metal-silicide layer is formed on top of the dielectric layer. The second metal-silicide layer and the dielectric layer are etched to form a top electrode and dielectric region. The first metal-silicide layer and the polysilicon layer are etched to form a bottom electrode.

20 Claims, 3 Drawing Sheets

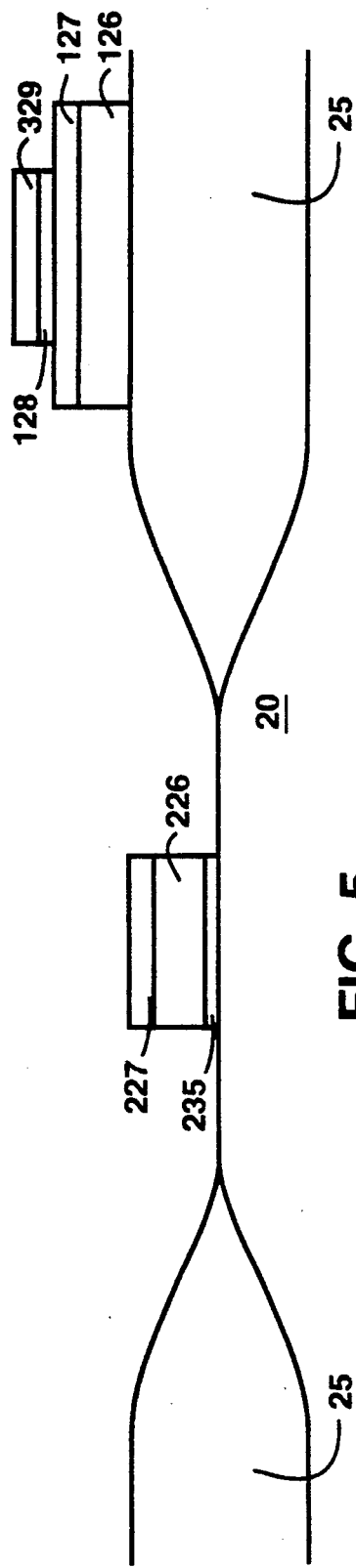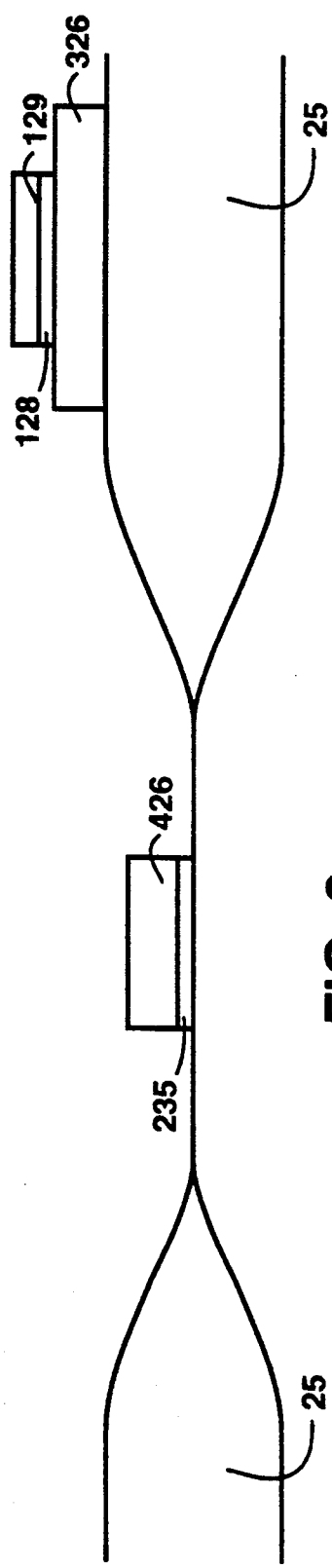

INTER-SILICIDE CAPACITOR

BACKGROUND

The present invention concerns the fabrication of an inter-silicide capacitor for use in very large scale integrated (VLSI) circuits.

Various capacitor structures have been investigated for use in VLSI circuits. For example, in the prior art a poly-to-poly capacitor, a metal-to-poly capacitor and a metal-to-polycide capacitor have been suggested and used. See for example, C. Kaya, H. Tigelaar, J. Paterson, M. de Wit, J. Fattaruso, D. Hester, S. Kiriakai, K. Tan, F. Tsay, *Polycide/Metal Capacitors for High Precision A/D Converters*, IEDM, 1988, pp. 782–785.

The voltage linearity of a capacitor is the change in normalized capacitance of the capacitor per unit change in the voltage across the capacitor. A smaller linearity implies a more stable capacitance, which is desirable. In poly-to-poly capacitors, increasing doping concentration of the polysilicon electrodes of a capacitor reduces the voltage linearity of the capacitor. However, as the circuit density of VLSI circuits increases, high doping of polysilicon can result in an increased potential for a leakage current through the oxide. See, for example, T. Ono, T. Mori, T. Ajioka, T. Takayashiki, *Studies of Thin Poly Si Oxides for E and $E^2PROM$*, IEDM, 1985, pp. 380–383, and T. Iida, M. Nakahara, S. Gotoh and H. Akiba, *Precise Capacitor Structure Suitable for Submicron Mixed Analog/Digital ASICs*, Custom Integrated Circuits Conference, 1990, pp. 18.5.1–18.5.4. Additionally, the fabrication of poly-to-poly capacitors generally requires high temperature doping and oxidation steps, which can adversely affect reliability and performance of the integrated circuit components. Also, the metal-to-poly capacitor and the metal-to-polycide require additional processing steps which add to the complexity of the circuit and in many cases adversely affect reliability, or compromise performance. For poly-to-poly capacitors in which the top electrode is polycide, the capacitor has poor characteristics which require additional processing. The additional processing can be cost prohibitive

SUMMARY OF THE INVENTION

In accordance with the preferred embodiment of the present invention, a method is presented for producing a capacitor during the course of integrated circuit fabrication. On a substrate, a polysilicon layer is formed over an insulating region. A first metal-silicide layer is formed on top of the polysilicon layer. A dielectric layer is formed on top of the first metal-silicide layer. A second metal-silicide layer is formed on top of the dielectric layer. The second metal-silicide layer and the dielectric layer are etched to form a top electrode and dielectric region. The first metal-silicide layer and the polysilicon layer are etched to form a bottom electrode.

In the preferred embodiment of the present invention, the first metal silicide layer and the second meta silicide layer are composed of Tungsten-silicide. The dielectric layer is, for example, a deposited silicon oxide using TEOS as the source of the silicon (also referred to as TEOS oxide). The first metal-silicide layer is etched so that the bottom electrode has a greater area than the top electrode. The polysilicon layer and the first metal silicide layer are also used to form gates for transistors on the integrated circuit.

The present invention has several advantages over the prior art processes. For example, the present invention provides for a method which is simple, practical and fully compatible with current VLSI processes. Integrating the capacitor of the present invention into a polycide-gate integrated circuit process does not perturb the characteristics of the integrated circuit components. Moreover, the resulting capacitor has superior linearity and low current leakage. The superior linearity results from the high conductivity of the capacitor electrodes. Further, the steps which are additional to conventional processing may be performed at relatively low processing temperatures, preserving reliability and performance of the VLSI circuitry.

BRIEF DESCRIPTION OF THE DRAWINGS

FIGS. 5 and 6 illustrate methods for producing a capacitor for use in integrated circuits in accordance with alternate embodiments of the present invention.

DETAILED DESCRIPTION OF THE PREFERRED EMBODIMENT

The present invention provides a method for fabricating a capacitor which is simple, practical and fully compatible with current VLSI processes. In the discussion below, conventional implant steps, such as implants for threshold voltage and substrate doping adjustments, or implants to form source/drain regions and isolation regions, are omitted as they are not germane to the formation of capacitors according to the preferred embodiment of the present invention.

Figure 1:
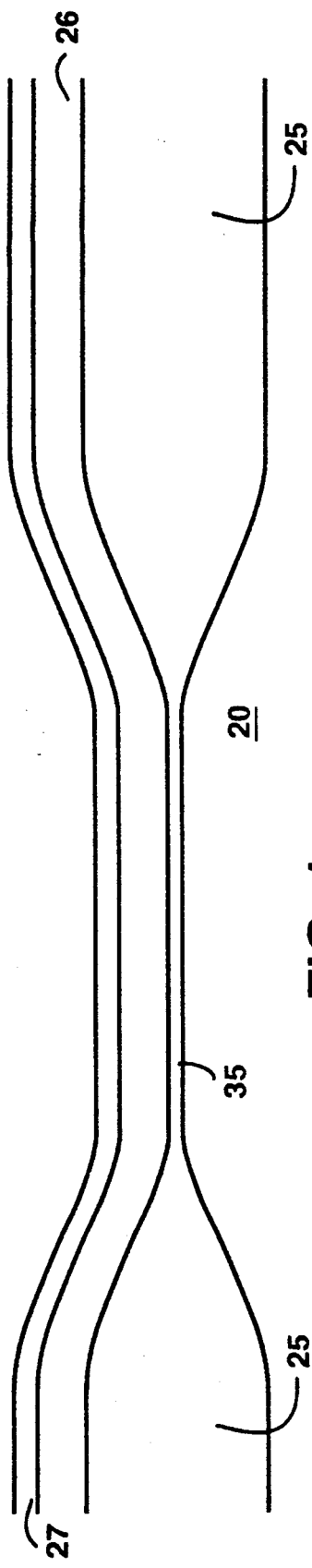
FIGS. 1, 2, 3 and 4 illustrate a method for producing an inter-silicide capacitor for use in integrated circuits in accordance with the preferred embodiment of the present invention.

FIG. 1 shows the result of conventional semiconductor processing. On a substrate 20, a local oxidation of silicon (LOCOS) process or other process is used to form an insulating layer 25 of, for example, field oxide on the substrate as shown. For example, in a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A layer of polysilicon 26 is deposited over the layer of gate oxide 35 and insulating layer 25. For example, the deposition may be a chemical vapor deposition (CVD). The polysilicon is doped, for example, with n-type atoms at approximately $10^{20}$ atoms per cubic centimeter. The doping may be performed using $POCl_3$. Alternately, an implant of Phosphorus or Arsenic atoms may be used. A metal-silicide layer 27 is formed on top of polysilicon layer 26, for example by chemical vapor deposition at approximately 400 degrees Centigrade or by sputtering at approximately 200 degrees Centigrade. For example, the metal-silicide may be Tungsten-silicide. The metal used for metal-silicide layer 27 may alternately consist of, for example, Titanium (Ti) Molybdenum (Mo), Chromium (Cr), Nickel (Ni), Cobalt (Co), or Tantalum (Ta).

Figure 2:
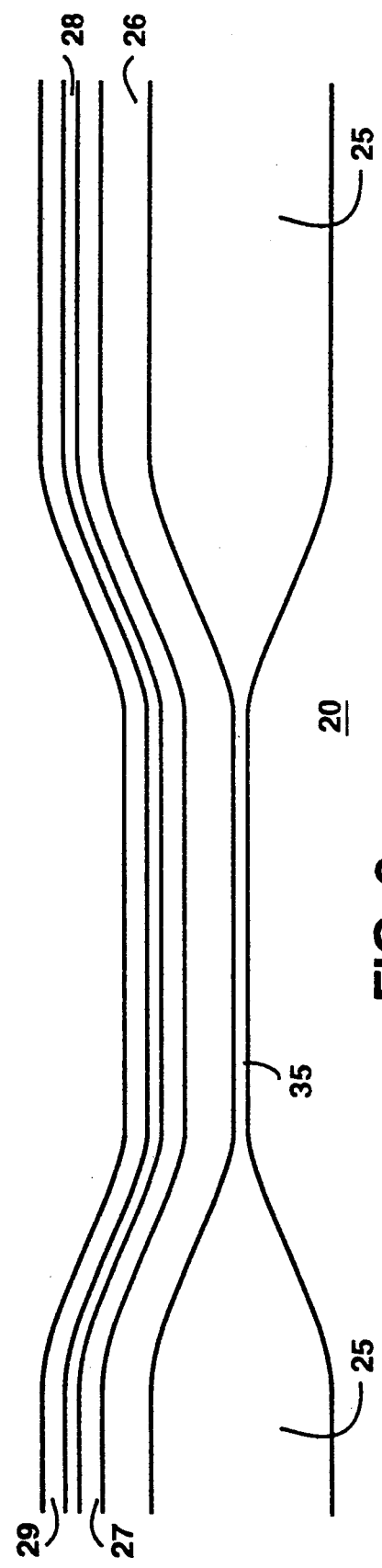
Figure 3:
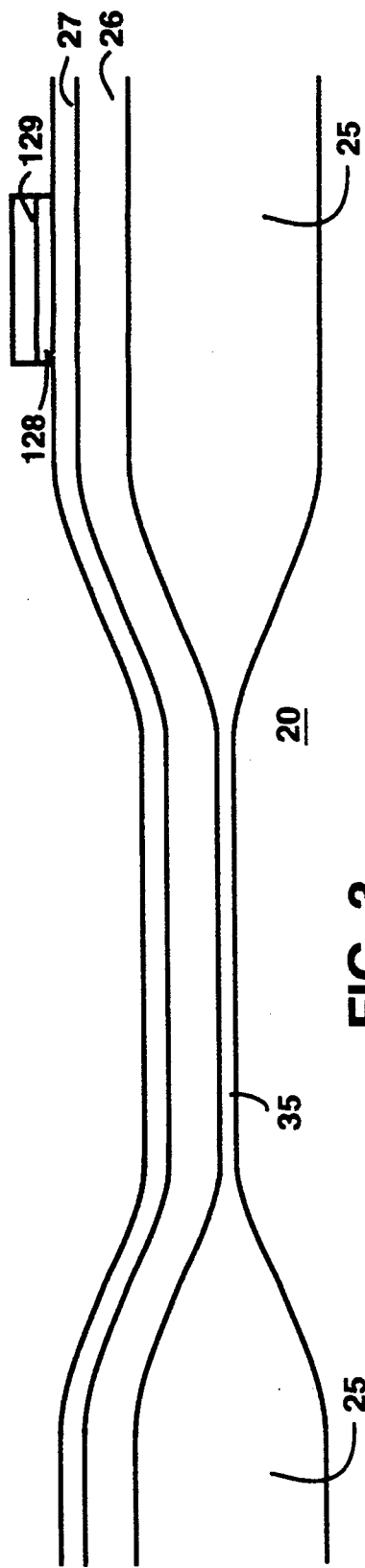

FIG. 2 and FIG. 3 illustrate additional processing steps which, when added to conventional processing, allow for the formation of an inter-silicide oxide capacitor. As illustrated by FIG. 2, a dielectric layer 28 is formed on top of metal-silicide layer region. Dielectric layer 28 may be, for example, a deposited silicon oxide using TEOS as the source of the silicon (also referred to as TEOS oxide). When deposited, the TEOS oxide is approximately 0.1 microns thick. Alternate source of silicon for the deposited oxide are silane and dichlorosilane. Alternative to the use of deposited oxide, thermally grown oxide may be used. Also, as an alternative to using an oxide dielectric, a sandwich of oxide, nitride and oxide sub-layers may be used for dielectric layer 28. As is understood in the art, the formation of the oxide, nitride and oxide sublayers may be achieved using processing operating at temperatures below 850 degrees Centigrade.

A metal-silicide layer 29 is formed on top of dielectric layer 28, for example by chemical vapor deposition at approximately 400 degrees Centigrade or by sputtering at approximately 200 degrees Centigrade. For example, the metal-silicide may be Tungsten-silicide. The metal used for metal-silicide layer 29 may alternately consist of, for example, Titanium (W) Molybdenum (Mo), Chromium (Cr), Nickel (Ni), Cobalt (Co), or Tantalum (Ta). When formed, metal-silicide layer 29 is, for example, 0.2 microns thick.

As illustrated by FIG. 3, a conventional mask and etch process is used to form a top electrode 129 and a dielectric region 128. As is understood in the art, dimensions for top electrode 129 and dielectric region 128 can vary significantly depending, for example, on the size of the capacitor required by the integrated circuit design. Once the etch is complete, the resist mask is removed. The depth of the etch of metal-silicide layer 29 and dielectric layer 28 to form to electrode 129 and dielectric region 128 is controlled so that the etch stops at layer 27.

Figure 4:
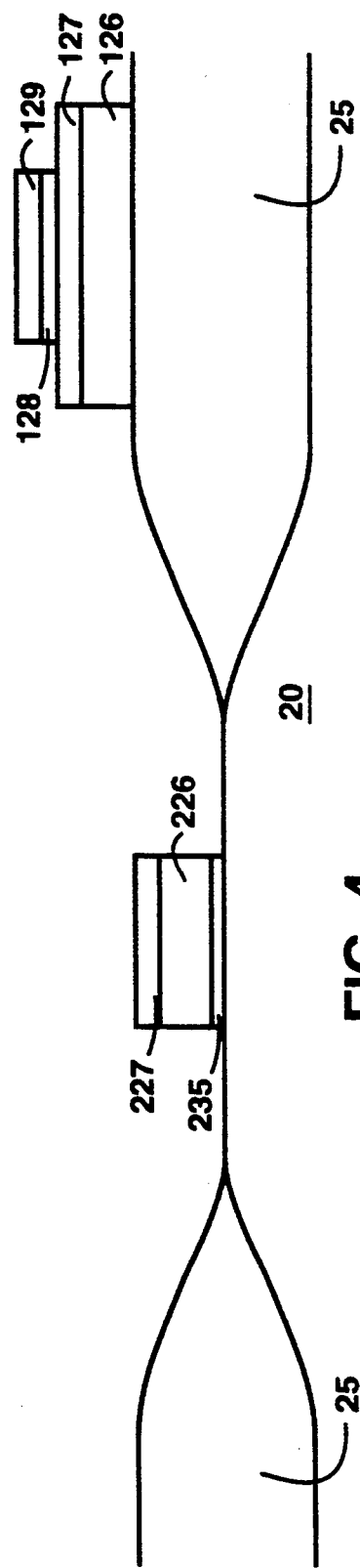

As illustrated by FIG. 4, conventional processing steps are resumed. A conventional mask and etch process is used to form a conventional gate consisting of a dielectric region 235, polysilicon region 226 and metal-silicide region 227. During this mask and etch, a bottom electrode for the capacitor is formed. The bottom electrode consists of a metal-silicide region 127 on top of a polysilicon region 126.

Further processing is conventional. For example, an insulating layer of a BPSG layer on top of a deposited silicon oxide layer are deposited over the wafer. For example, the deposited silicon oxide layer is 0.15 microns and the BPSG layer is 0.4 microns. The insulating layer is masked and etched to produce connection holes. A metal layer is then deposited. The metal layer, through the connection holes, is electrically connected to metal silicide region 127, metal silicide region 129 and metal silicide region 227.

The present invention has several advantages over the prior art processes. For example, the present invention provides for a method which is simple, practical and fully compatible with current VLSI processes using polycide transistor gates. The performance characteristics of the integrated circuit components are unperturbed. The resulting capacitor has superior linearity and low current leakage. Further, the additional steps which are additional to conventional processing may be performed at relatively low processing temperatures (e.g., less than 850 degrees Centigrade), preserving reliability of the VLSI circuitry.

Several alternate embodiments of the present invention exist. For example, instead of metal-silicide layer 29, a doped polysilicon layer may be formed. The remaining processing steps remain the same. The resulting structure is shown in FIG. 5 where a resulting top electrode 329 is doped polysilicon.

Additionally, the present invention may be utilized when the gate is formed of doped polysilicon. In this case, the formation of metal silicide layer 27 is omitted. Polysilicon layer 26 is doped, for example, with n-type atoms at approximately $5 \times 10^{20}$ atoms per cubic centimeter. The doping may be performed using $POCl_3$. Alternately, an implant of Phosphorus or Arsenic atoms may be used. The resulting structure is shown in FIG. 6. There, a conventional polysilicon gate structure is shown to consist of a doped polysilicon region 426 placed over dielectric region 235. The bottom electrode for the capacitor consists of a doped polysilicon region 326.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a capacitor comprising the steps of:
   (a) forming a polysilicon layer over an insulating region on a substrate;
   (b) forming a first metal-silicide layer on top of the polysilicon layer;
   (c) forming a dielectric layer on top of the first metal-silicide layer;
   (d) forming a second metal-silicide layer on top of the dielectric layer;
   (e) etching the second metal-silicide layer and the dielectric layer to form a top electrode and a dielectric region; and,
   (f) etching the first metal-silicide layer and the polysilicon layer to form a bottom electrode.

2. A method as in claim 1 wherein the etching performed in step (f) also forms a gate of transistor.

3. A method as in claim 1 wherein in step (b) the first metal silicide layer is composed of Tungsten-silicide and wherein in step (d) the second metal silicide layer is composed of Tungsten-silicide.

4. A method as in claim 1 wherein the dielectric layer is composed of deposited silicon oxide.

5. A method as in claim 1 wherein the dielectric layer is composed of thermally grown oxide.

6. A method as in claim 1 wherein the dielectric layer is composed of a sandwich of oxide, nitride and oxide sub-layers.

7. A capacitor structure on an integrated circuit, the capacitor structure comprising:
   a bottom electrode;
   a dielectric region formed on top of the bottom electrode; and,
   a top electrode on top of the dielectric region, the top electrode being formed of metal-silicide.

8. A capacitor as in claim 7 wherein a layer used to form the bottom electrode is also used to form a gate of a transistor.

9. A capacitor as in claim 7 wherein the top electrode is composed of Tungsten-silicide.

10. A capacitor as in claim 7 wherein the dielectric region is formed of deposited silicon oxide.

11. A capacitor as in claim 7 wherein the dielectric region is formed of thermally grown oxide.

12. A capacitor as in claim 7 wherein the dielectric region is formed of a sandwich of oxide, nitride and oxide sub-layers.

13. A method for producing a capacitor comprising the steps of:
   (a) forming a conductive layer over an insulating region on a substrate;
   (b) forming a dielectric layer on top of the conductive layer;
   (c) forming a metal-silicide layer on top of the dielectric layer;
   (d) etching the metal-silicide layer and the dielectric layer to form a top electrode and a dielectric region; and,
   (e) etching the conductive layer to form a bottom electrode.

14. A method as in claim 13 wherein the etching performed in step (e) also forms a gate of a transistor.

15. A method as in claim 13 wherein the step (a) comprises forming a doped polysilicon layer.

16. A method as in claim 13 wherein the step (a) comprises forming a doped polysilicon sub-layer and on top of the doped polysilicon sub-layer, forming a metal silicide sub-layer.

17. A method as in claim 16 wherein in step (a) the metal silicide sub-layer is composed of Tungsten-silicide and wherein in step (c) the metal silicide layer is composed of Tungsten-silicide.

18. A method as in claim 13 wherein step (b) comprises forming a layer of deposited silicon oxide.

19. A method as in claim 13 wherein step (b) comprises forming a layer of thermally grown oxide.

20. A method as in claim 13 wherein step (b) comprises forming sub-layers of oxide, nitride and oxide.

* * * * *